United States Patent [19]

Metcalf

[11] 4,166,963
[45] Sep. 4, 1979

[54] BUFFER CIRCUIT FOR A DATA HIGHWAY

[75] Inventor: Eric Metcalf, Ropley, England

[73] Assignee: The Solartron Electronic Group Limited, Farnborough, England

[21] Appl. No.: 835,257

[22] Filed: Sep. 21, 1977

[30] Foreign Application Priority Data

Sep. 30, 1976 [GB] United Kingdom ............... 40661/76

[51] Int. Cl.² .............................................. H03K 5/00
[52] U.S. Cl. .................................... 307/260; 307/264; 307/270; 307/DIG. 1
[58] Field of Search ........... 37/260, 296, 270, DIG. 1, 37/264, 237

[56] References Cited

U.S. PATENT DOCUMENTS 3,755,693  8/1973  Lee ....................................... 307/237

Primary Examiner—John Zazworsky
Attorney, Agent, or Firm—Kevin McMahon; Edward D. Manzo; Martin Novack

[57] ABSTRACT

A line buffer circuit for coupling an interface to a data highway without requiring separate signal paths for sense and drive functions, comprises a unity-gain voltage amplifier coupling a line in the highway to the respective interface terminal for the sense function, and a current source connected to sink current from the highway line to ground for the drive function. The current source is controlled so that the current passing through it is proportional to the magnitude of the current passing from the amplifier through the interface terminal.

8 Claims, 5 Drawing Figures

BUFFER CIRCUIT FOR A DATA HIGHWAY

The present invention relates to a buffer circuit for use in connecting an interface unit to a data highway. Interface units typically connect devices to a highway; devices may be data sources and/or acceptors, or controllers such as data processing units (which are also sources and acceptors). Interface units perform various logical functions concerned with recognition of addresses, distinguishing data from commands, handshaking, sending back service requests and so on. See for example our British patent specifications Nos. 1,463,626 and 1,467,726 and Application No. 29375/76.

Further description of the prior art and of the invention will be given, by way of example, with reference to the accompanying drawings, in which.

Figure 1:
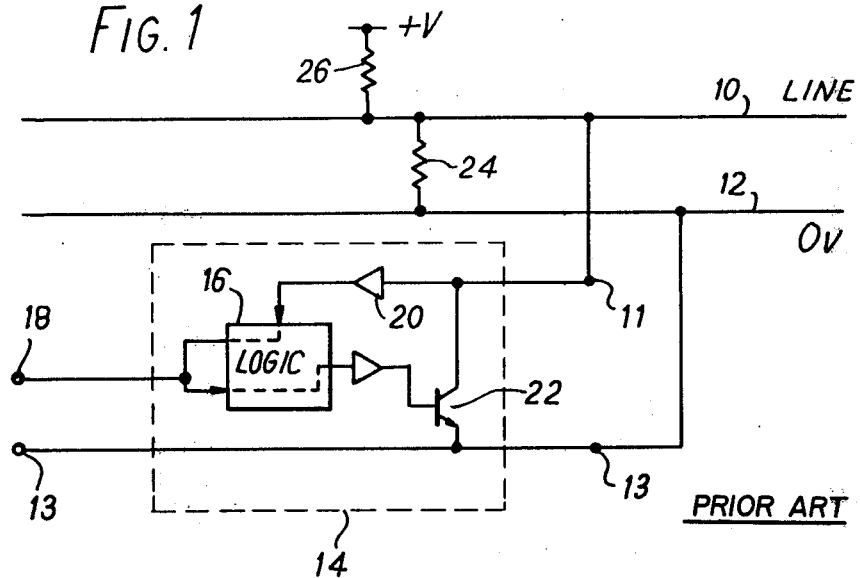
FIGS. 1 and 1a show known highway and interface systems.

A highway comprises a plurality of lines of which one is a common signal ground, a plurality of lines are data lines and further lines are dedicated to handshake and control functions. In the current proposals of the International Electrotechnical Commissions, a data highway has 8 data lines (for 7-bit plus parity bit bytes) and 8 further lines, namely 3 handshake lines and 5 lines dedicated to command functions. Such a highway will be called on IEC highway. It will be convenient from hereon to restrict the term "line" to a highway line other than the signal ground line, which will be called the ground connection. It will further be convenient to consider the invention in terms of a single line in conjunction with the common ground connection and FIG. 1 shows the single line (LINE) 10 and the ground connection (OV) 12. An interface unit 14 includes the interface logic 16, a highway input/output terminal 11 connected to the line 10, a common ground terminal 13 connected to the ground connection 12, a device input-/output terminal 18 for the interfaced device, a sensing amplifier 20 and a driver transistor 22. The terminals 11 and 18, amplifier 20 and driver transistor 22 are repeated for the other highway lines. The terminals 11 may be referred to collectively as port A and the terminals 18 as port B. In the case of an interface for an IEC highway, each port comprises 16 terminals. The logic 16 performs, among other things, a gating function which allows the operation of each terminal 11 and 18 selectively as an input and an output terminal, as explained for example in the specification of our aforementioned British Application No. 29375/76. Thus the logic 16 includes status circuits which determine whether singals are being received at or sent out from each port.

An interface unit may at one time be driving the highway, with the driver transistor 22 turned on, or sensing the logical level of the highway line 10 (driver transistor turned off and the output of the sensing amplifier 20 indicating the state of the line). To the interface unit 14, the highway appears to be loaded as indicated by resistors 24 and 26 representing the total loading, whether the loading arises from lumped or distributed impedances. The more interfaces there are connected to the highway, the greater the loading (i.e. the smaller the resistive impedances).

If the interface unit is connected directly to the highway, as in FIG. 1, the current drive capability of the driver transistor 22 must be sufficient to handle the maximum permitted highway loading, when the highway has connected thereto the maximum number of interfaces permitted. Therefore an integrated circuit implementation of the interface unit has to contain large driver transistors, even although many applications of the unit will require only modest driving capability.

Figure 1A:
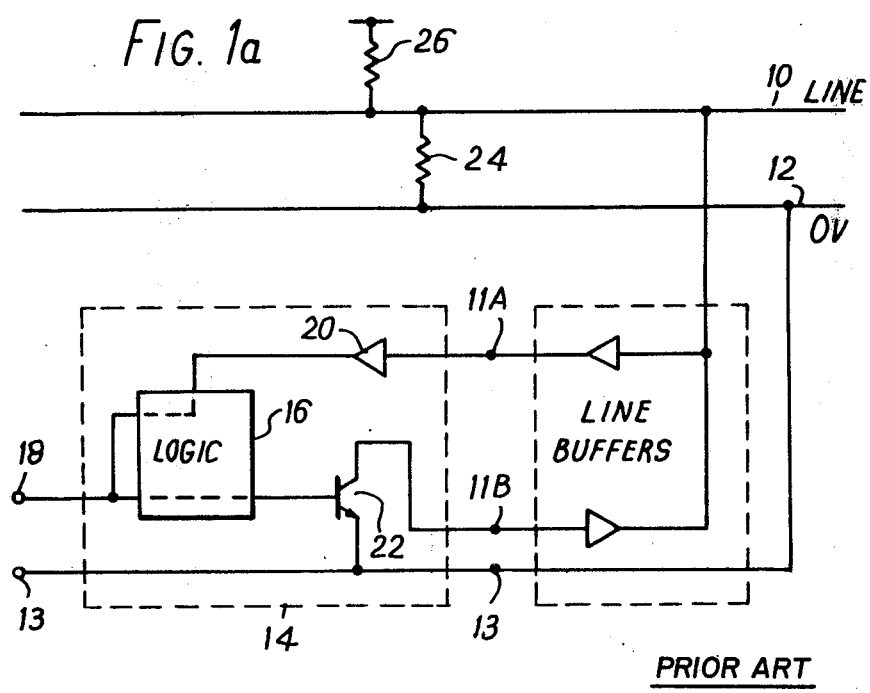

A known solution is not to use such large transistors but to match the driver transistors 22 to the best economic compromise between area and prower consumption of the IC chip and its normal range of application. When an application requires a bigger drive capability, line buffers are interposed between the interface unit and the highway. One known practice requires the interface side of the line buffer and the highway side of the interface unit to have two terminals for a single line 10 in addition to the common ground terminal. In other words the sense and drive functions have to be provided with separate circuitry on the highway side of the interface unit. The situation is as illustrated in FIG. 1a, the terminal 11 of FIG. 1 being split into terminals 11A and 11B. Alternatively, it would be necessary to gate the amplifiers in the line buffers to distinguish between input and output modes. In other words the gating effected in the logic 16 would have to be extended to the line buffers and this would require further terminals common to the interface unit and the line buffers.

The fact that the line buffers have a large number of terminals is not too much of a problem; they can be split between as many integrated circuit chips as is necessary. However the increased number of interface terminals creates a severe problem because the complexity of the interface makes it more or less impossible to divide it into more than one integrated circuit. If the interface unit has two sixteen-terminal ports and is in a 40-pin LSI pack, (the standard maximum number of pins for an LSI pack is 40 pins), the remaining 8 pins of the 40 are only just sufficient for the power supply, common ground connection and patch pins enabling the interface to be patched with its own address. It is therefore out of the question either to double up the number of port terminals (as in FIG. 1a) or to provide terminals for applying gating signals to the buffer amplifiers; there are no spare terminals available.

The object of the present invention is to provide a line buffer circuit which does not require the sense and drive functions to be separated on the highway side of the interface unit and which therefore requires only one terminal per port per highway line. A 40-pin LSI pack can then still handle an IEC highway and yet be provided with line buffers.

The line buffer circuit according to the present invention comprises a common signal ground terminal, and in respect of each highway line, a highway terminal connected to an interface unit terminal through a voltage amplifier, a controlled current sink connected between the highway terminal and the ground terminal and control means responsive to the current flowing through the interface unit terminal so as to control the current sink that, in operation, the current therethrough is proportional to the current flowing through the interface unit terminal.

The gain of the amplifier and the constant of proportionality between the sink current and the terminal current will be chosen in dependence upon the logical levels on the two sides of the buffer circuit. The buffer circuit can thus be used to match differing logical levels. If the logical levels on the highway side and the interface side are the same, as will commonly be the case, the amplifier voltage gain may be substantially unity and the sink current may be a multiple greater than unity of the current flowing through the interface unit terminal.

Figure 2:
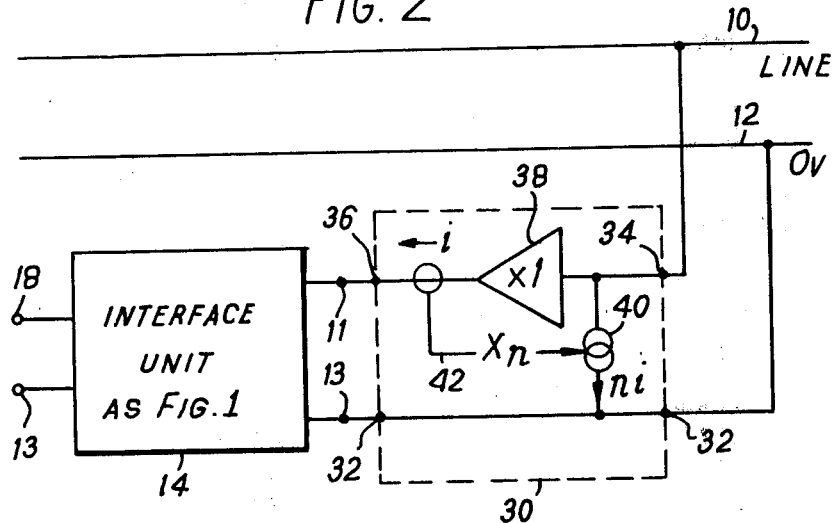
FIGS. 2 and 4 illustrate the principle of the invention.

The principle of the invention is illustrated in FIG. 2. The line buffer circuit 30 has a common ground terminal 32 connected to the common ground connection 12 and to the interface common ground terminal 13, a highway terminal 34 connected to the line 10 and an interface unit terminal 36 connected to the interface terminal 11. The terminal 34 is connected to the terminal 36 through a unity gain voltage amplifier 38 which ensures that the voltage on the highway terminal 34 is transmitted to the interface unit terminal 36. A controlled current sink 40 is connected between the terminals 34 and 32 and, as schematically represented at 42, the current through the sink is controlled to be n i, where i is the current between the amplifier 38 and the terminal 36. n is typically greater than unity. In some applications a value of say 2 may suffice although n may be larger than this.

Figure 3:
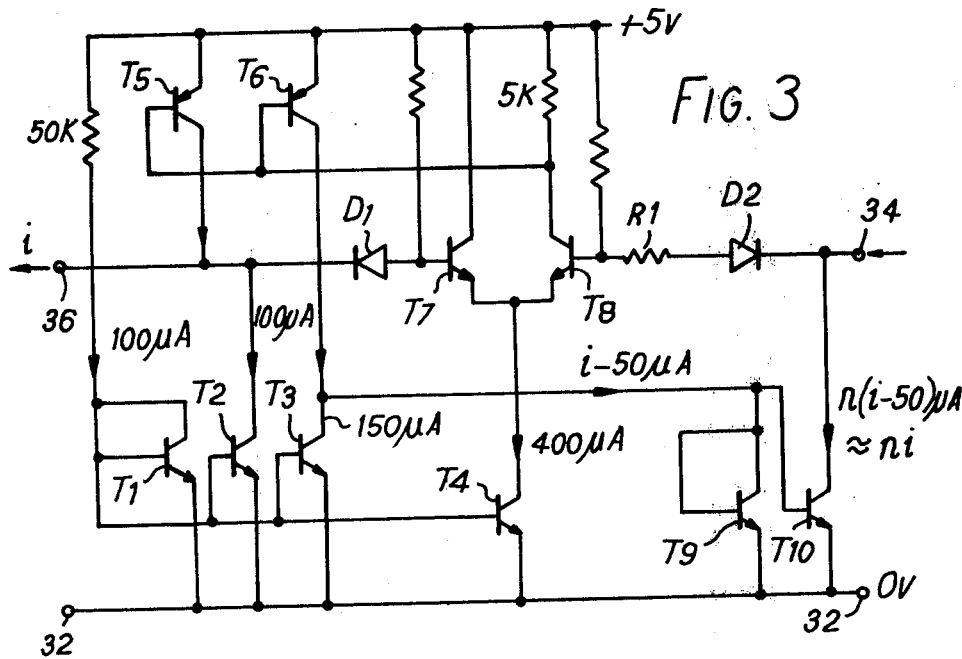
FIG. 3 is a circuit diagram of an embodiment of the invention.

A practical circuit embodying the invention is illustrated in FIG. 3 which is a more detailed diagram of the buffer circuit 30 of FIG. 2.

In FIG. 3 the unity gain voltage amplifier 38 of FIG. 2 is constituted by the transistors T7, T8 and T5 from which it will be seen that the amplifier has 100% shunt feedback. The controlled current sink 40 of FIG. 2 is constituted by the transistor T10 and the control circuit for controlling the current through the current sink T10 is provided by the transistors T1, T2, T3 and T6.

The transistors T2, T3 and T4 constitute current sinks controlled by T1 and T5 and T6 are a transistor pair having base emitter junctions in parallel whereby they pass currents in a ratio defined by their emitter areas (normally 1:1). The transistors T9 and T10 are a similar pair in which T10 is n times the emitter area of T9 and hence passes n times the current of T9. In the amplifier T5, T7 and T8 the diodes D1 and D2 are merely required to ensure that the transistors T7 and T8 have "on bias" when input and output are at OV. The resistor R1 between the diode D2 and the base of the transistor T8 ensures that the transistor T8 is bottomed when the interface unit terminal 36 is at OV. It will be seen that T3 passes 150 micro-amps whereas T2 passes 100 microamps. This is to ensure that the current sink T10 is turned off when i=0.

Figure 4:
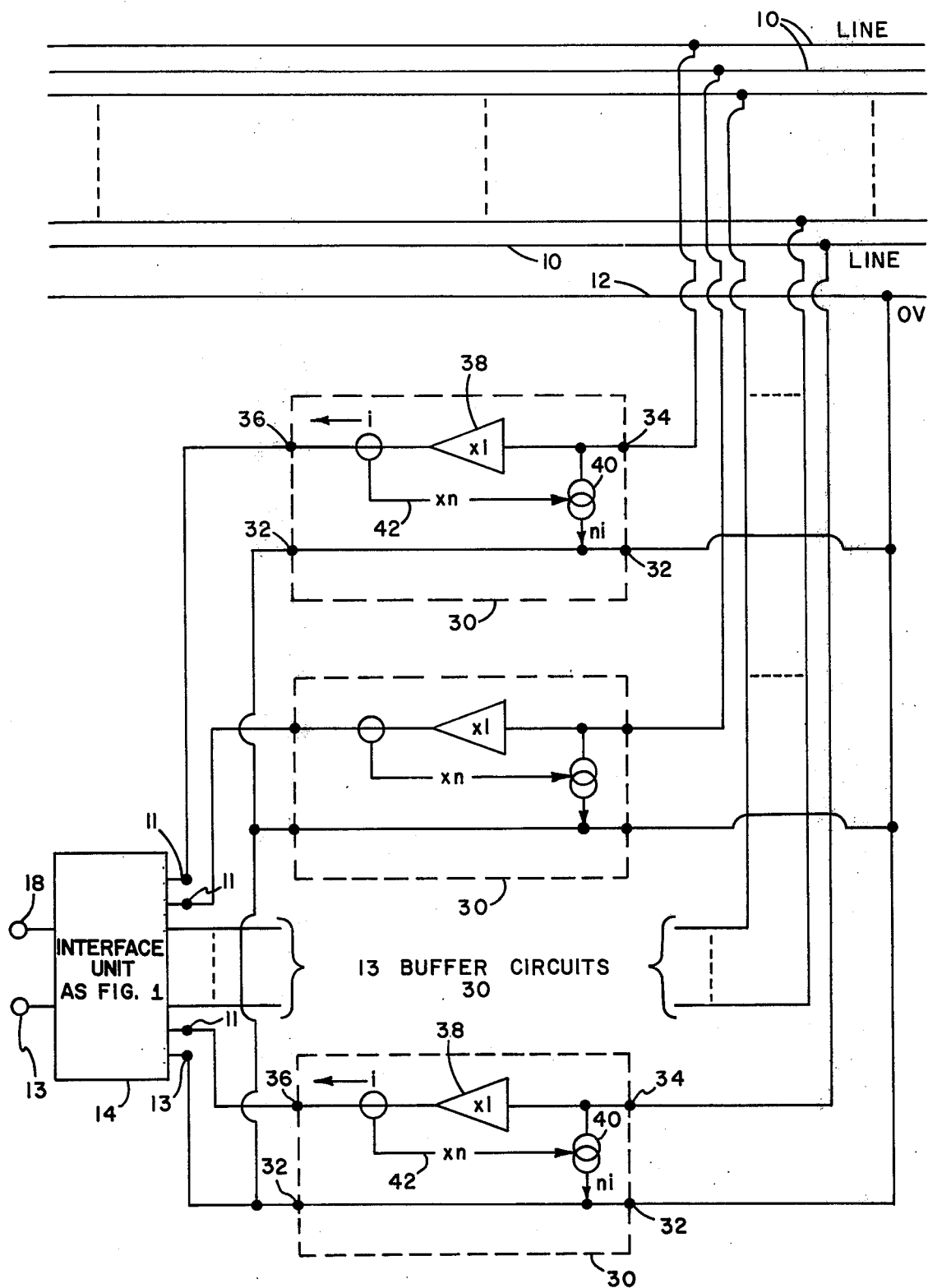

As noted earlier, a typical data highway such as the IEC circuit has 16 lines and, in this case, it will be understood that an individual line buffer circuit 30 is provided for each line 10, as indicated in FIG. 4.

What is claimed is:

1. A line buffer circuit for use in connecting an interface unit to a data highway comprising:
   a common signal ground terminal,
   a highway terminal connected to an interface unit terminal through a voltage amplifier,
   a controller responsive to the current flowing through said interface unit terminal,
   a controlled current sink coupled between said highway terminal and said ground terminal, said current sink being responsively coupled to said controller,
   said controller causing said current sink to conduct a current proportional to said current flowing through said interface unit terminal.

2. A line buffer circuit according to claim 1, wherein the amplifier voltage gain is substantially unity.

3. A line buffer circuit according to claim 1, wherein the current through the current sink is at least twice the current flowing through the interface unit terminal.

4. In combination, a line buffer circuit, a data highway comprising a plurality of highway lines and a common ground connection, and an interface unit comprising two ports and a common signal ground terminal which is connected to the common ground connection, one of said ports including a plurality of terminals each corresponding to a respective one of said highway lines, said line buffer circuit comprising:
   a common signal ground terminal connected to said common ground connection, and, in respect of each said highway line,
   a voltage amplifier connecting the respective highway line to its corresponding terminal of said one port, a controlled current sink connected between the highway line and the ground terminal, and
   control means responsive to the current flowing through said corresponding terminal and being operatively coupled to said current sink to control the current sink to conduct a current proportional to the said current flowing through said corresponding terminal.

5. A line buffer circuit for use in coupling an interface unit to a data highway, said interface unit having a common signal ground coupled to a common signal ground of said highway and an interface terminal via which said interface unit is coupleable to a line of said highway, said interface unit being operative to either sense a voltage on the highway line via said interface terminal or to drive said highway line by applying current loading between said interface terminal and said common signal ground; the line buffer circuit; comprising:
   a voltage amplifier coupling said highway line to said interface terminal;
   a controlled current sink coupled between said highway line and common signal ground; and
   control means responsive to the current flowing through the interface terminal and operative to control the current sink to conduct a current proportional to the current flowing through the said interface terminal.

6. A line buffer circuit according to claim 5, wherein the amplifier voltage gain is substantially unity.

7. A line buffer circuit according to claim 5, wherein the current through the current sink is at least twice the current flowing through the interface terminal.

8. A line buffer circuit according to claim 6, wherein the current through the current sink is at least twice the current flowing through the interface terminal.

* * * * *